(12) United States Patent
Wright et al.

(10) Patent No.: US 10,727,195 B2
(45) Date of Patent: Jul. 28, 2020

(54) BOND MATERIALS WITH ENHANCED PLASMA RESISTANT CHARACTERISTICS AND ASSOCIATED METHODS

(71) Applicant: Technetics Group LLC, Charlotte, NC (US)

(72) Inventors: Jason Wright, Santa Clara, CA (US); Angus McFadden, Santa Clara, CA (US)

(73) Assignee: Technetics Group LLC, Charlotte, NC (US)

( * ) Notice: Subject to any disclaimer, the term of this patent is extended or adjusted under 35 U.S.C. 154(b) by 0 days.

(21) Appl. No.: 16/125,161

(22) Filed: Sep. 7, 2018

(65) Prior Publication Data
US 2019/0088613 A1 Mar. 21, 2019

Related U.S. Application Data

(60) Provisional application No. 62/559,008, filed on Sep. 15, 2017.

(51) Int. Cl.
*H01L 23/00* (2006.01)
*C09J 7/25* (2018.01)
(Continued)

(52) U.S. Cl.
CPC ............. *H01L 24/29* (2013.01); *C09J 7/10* (2018.01); *C09J 7/255* (2018.01); *C09J 7/38* (2018.01);
(Continued)

(58) Field of Classification Search
CPC ......... H01L 24/29; H01L 24/27; H01L 24/33; H01L 24/32; H01L 24/30; H01L 2224/27334; H01L 2224/27618; H01L 2224/27622; H01L 2224/27436; H01L 2924/062; H01L 2924/0685; H01L 2924/0715; H01L 2224/30505;
(Continued)

(56) References Cited

U.S. PATENT DOCUMENTS

| 4,314,231 A * | 2/1982 | Walty ..................... H01C 7/027 338/212 |
| 5,344,703 A * | 9/1994 | Kovar ....................... B32B 7/12 428/312.6 |

(Continued)

OTHER PUBLICATIONS

International Search Report and Written Opinion for PCT/2018/050294 dated Nov. 8, 2018.

*Primary Examiner* — David Sample
*Assistant Examiner* — Donald M Flores, Jr.
(74) *Attorney, Agent, or Firm* — Perkins Coie LLP (57) ABSTRACT

Several embodiments of the present technology are directed to bonding sheets having enhanced plasma resistant characteristics, and being used to bond to semiconductor devices. In some embodiments, a bonding sheet in accordance with the present technology comprises a base bond material having one or more thermal conductivity elements embedded therein, and one or more etched openings formed around particular regions or corresponding features of the adjacent semiconductor components. The bond material can include PDMS, FFKM, or a silicon-based polymer, and the etch resistant components can include PEEK, or PEEK-coated components.

20 Claims, 4 Drawing Sheets

(51) Int. Cl.
*C09J 7/38* (2018.01)
*C09J 11/06* (2006.01)
*C09J 11/04* (2006.01)
*C09J 7/10* (2018.01)

(52) U.S. Cl.
CPC ............... *C09J 7/383* (2018.01); *C09J 11/04* (2013.01); *C09J 11/06* (2013.01); *H01L 24/27* (2013.01); *H01L 24/30* (2013.01); *H01L 24/32* (2013.01); *H01L 24/33* (2013.01); *C09J 2201/40* (2013.01); *C09J 2203/326* (2013.01); *C09J 2400/123* (2013.01); *C09J 2421/00* (2013.01); *C09J 2467/006* (2013.01); *C09J 2471/00* (2013.01); *C09J 2483/00* (2013.01); *H01L 2224/27334* (2013.01); *H01L 2224/27436* (2013.01); *H01L 2224/27618* (2013.01); *H01L 2224/27622* (2013.01); *H01L 2224/2919* (2013.01); *H01L 2224/2957* (2013.01); *H01L 2224/29076* (2013.01); *H01L 2224/29291* (2013.01); *H01L 2224/29387* (2013.01); *H01L 2224/29564* (2013.01); *H01L 2224/29687* (2013.01); *H01L 2224/3016* (2013.01); *H01L 2224/30505* (2013.01); *H01L 2224/32055* (2013.01); *H01L 2224/32057* (2013.01); *H01L 2224/32145* (2013.01); *H01L 2224/32225* (2013.01); *H01L 2224/3316* (2013.01); *H01L 2924/0533* (2013.01); *H01L 2924/0573* (2013.01); *H01L 2924/062* (2013.01); *H01L 2924/0685* (2013.01); *H01L 2924/0715* (2013.01); *Y10T 428/22* (2015.01); *Y10T 428/24273* (2015.01); *Y10T 428/24298* (2015.01); *Y10T 428/24322* (2015.01); *Y10T 428/24802* (2015.01); *Y10T 428/249953* (2015.04); *Y10T 428/249955* (2015.04); *Y10T 428/249956* (2015.04); *Y10T 428/249958* (2015.04); *Y10T 428/249967* (2015.04); *Y10T 428/249975* (2015.04); *Y10T 428/249982* (2015.04); *Y10T 428/249984* (2015.04); *Y10T 428/249985* (2015.04); *Y10T 428/249986* (2015.04); *Y10T 428/249994* (2015.04); *Y10T 428/249999* (2015.04)

(58) Field of Classification Search
CPC ..... H01L 2224/3016; H01L 2224/3316; H01L 2224/32225; H01L 2224/32145; H01L 2924/0573; H01L 2924/0533; H01L 2224/29564; H01L 2224/29687; H01L 2224/2957; H01L 2224/29387; H01L 2224/32057; H01L 2224/32055; H01L 2224/2919; H01L 2224/29076; H01L 2224/29291; C09J 7/10; C09J 11/04; C09J 11/06; C09J 7/383; C09J 7/38; C09J 7/255; C09J 2471/00; C09J 2201/40; C09J 2483/00; C09J 2467/006; C09J 2400/123; C09J 2203/326; C09J 2421/00; Y10T 428/22; Y10T 428/24273; Y10T 428/24298; Y10T 428/24322; Y10T 428/24802; Y10T 428/249953; Y10T 428/249955; Y10T 428/249956; Y10T 428/249958; Y10T 428/249967; Y10T 428/249975; Y10T 428/249982; Y10T 428/249984; Y10T 428/249985; Y10T 428/249986; Y10T 428/249994; Y10T 428/249999
USPC ... 428/67, 131, 134, 136, 137, 195.1, 304.4, 428/306.6, 307.3, 308.4, 312.2, 314.2, 428/317.1, 317.5, 317.7, 317.9, 320.2, 428/322.7
See application file for complete search history.

(56) References Cited

U.S. PATENT DOCUMENTS

| | | | |
|---|---|---|---|
| 5,585,178 A * | 12/1996 | Calhoun | B32B 7/12 428/343 |
| 2005/0118845 A1 | 6/2005 | Kobayashi et al. | |
| 2005/0153101 A1 | 7/2005 | Yamaguchi et al. | |
| 2007/0241303 A1* | 10/2007 | Zhong | C08K 3/38 252/62.3 T |
| 2011/0159238 A1 | 6/2011 | Kawamori et al. | |
| 2012/0100379 A1* | 4/2012 | Luo | C08J 5/125 428/421 |
| 2012/0248632 A1 | 10/2012 | Mitsukura | |
| 2016/0160102 A1 | 6/2016 | Minegishi et al. | |

\* cited by examiner

BOND MATERIALS WITH ENHANCED PLASMA RESISTANT CHARACTERISTICS AND ASSOCIATED METHODS

RELATED APPLICATIONS

This application claims priority to U.S. Provisional Patent Application No. 62/559,008, filed Sep. 15, 2017, the entirety of which is hereby incorporated by reference.

TECHNICAL FIELD

The present disclosure relates to bonding materials used during semiconductor device processing, and more particularly relates to bonding materials having enhanced resistant characteristics against plasma and/or etch processing.

BACKGROUND

Semiconductor assemblies include individual semiconductor components or parts that are attached to one another using one or more bond materials. During operation in a process chamber, the individual components and bond materials are exposed to plasma environments, such as etch processes that occur at temperatures and chemistries that can be damaging to the bond materials. In such environments, the bond materials can be subject to significant erosion, thereby causing the bond materials to have shorter lifetimes and an increased likelihood of delamination.

Additionally, the erosion of bond materials can lead to an increase in particles and thermal non-uniformity within a semiconductor manufacturing chamber. One method to deal with this issue is to use a bond material with high plasma resistance to protect against erosion. One drawback of this method, however, is that the plasma resistant material can be very expensive and may, over time, be consumed. As such, the expense of this method makes it impractical for use on many semiconductor components. Another attempted method to deal with this issue is to shield the bond material from the plasma etch processes such that the bond material is not exposed to the plasma environment. This method, however, has also become impractical for many applications because there is a continued need for semiconductor component geometries to get smaller, and thus it is often too difficult to completely shield a bond material such that it is not exposed. Accordingly, there exists a need for other approaches to provide bond materials that have a greater ability to withstand plasma and etch processes.

DETAILED DESCRIPTION

In the following description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with semiconductor devices are not shown, or are not described in detail, to avoid obscuring other aspects of the technology. In general, it should be understood that various other devices, systems, and methods in addition to those specific embodiments disclosed herein may be within the scope of the present technology.

As discussed above, bond materials used for bonding semiconductor devices and/or parts are continually designed with ever greater needs to withstand plasma environments and chemistries, which have conventionally lead to high particle generation. Accordingly, several embodiments of bond materials in accordance with the present technology include a bonding sheet that produces significantly less particle generation compared to conventional bond materials when exposed to plasma environments. The bond material of the present technology is positioned between and attaches a first semiconductor component to a second semiconductor component. The bonding sheet can include a base bond material and a plurality of thermal conductivity elements incorporated therein. The thermal conductivity elements can include organic and/or inorganic fillers, and in some embodiments are configured to decompose into the gas phase during semiconductor processing. The bonding sheet can further include etched openings filled with etch resistant components.

Figure 1A:
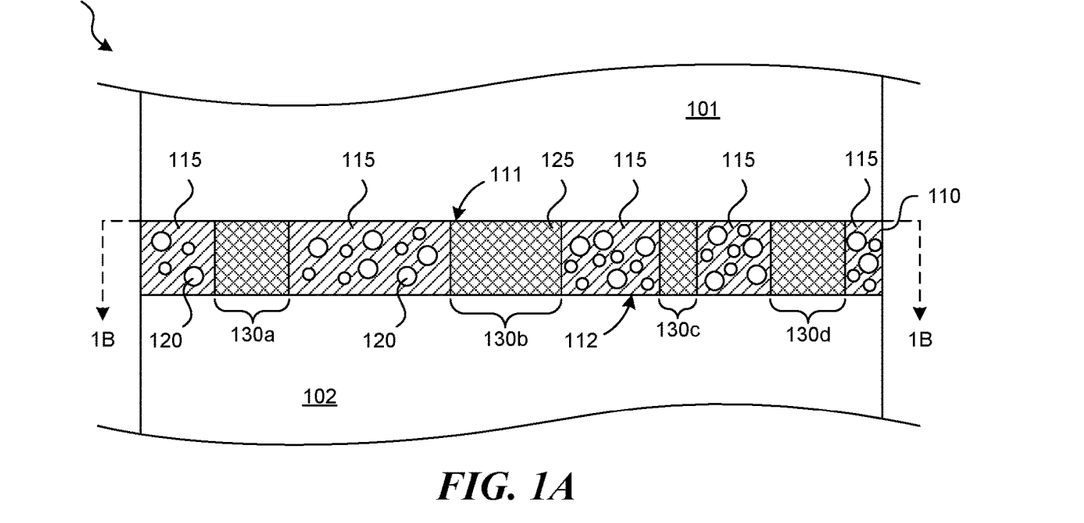
FIG. 1A is a schematic cross-sectional view of a semiconductor assembly taken along line 1A-1A of FIG. 1B in accordance with an embodiment of the present technology.
Figure 1B:
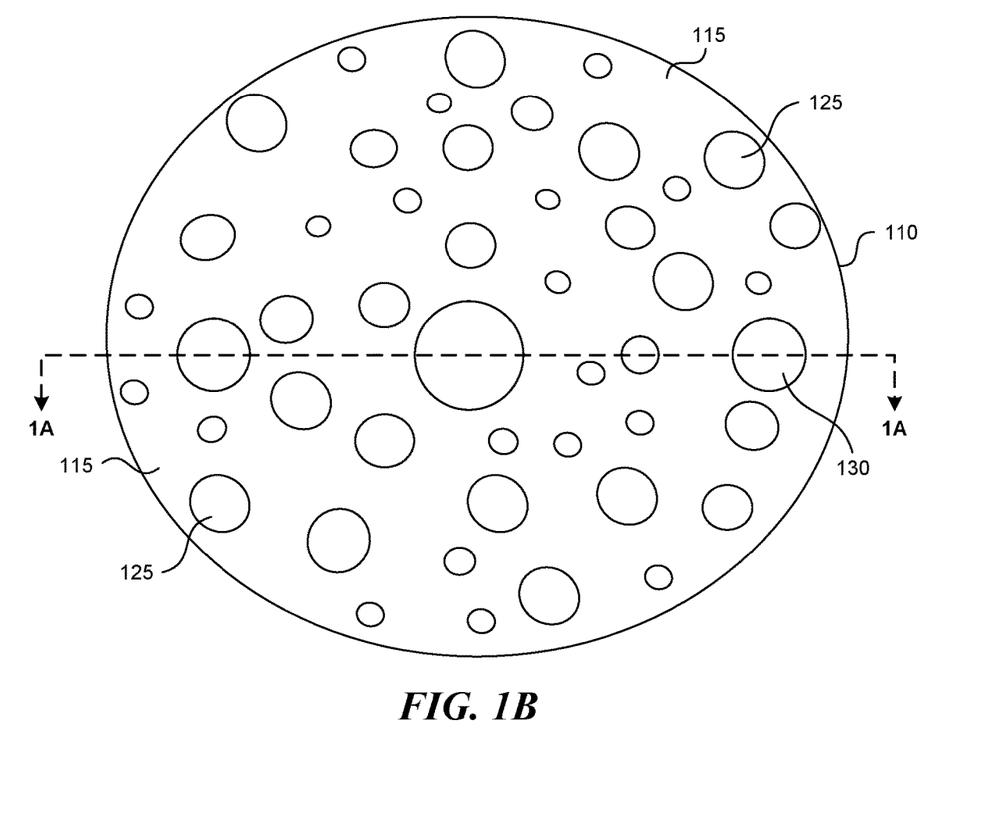
FIG. 1B is a schematic top plan view of the semiconductor assembly shown in FIG. 1A taken along line 1B-1B of FIG. 1A in accordance with an embodiment of the present technology.

FIG. 1A is a schematic cross-sectional view of a semiconductor assembly 100 ("assembly 100"), and FIG. 1B is a schematic top plan view of the assembly 100 taken along line 1B-1B of FIG. 1A. Referring to FIGS. 1A and 1B together, the assembly 100 includes a first semiconductor component 101, a second semiconductor component 102, and a bonding sheet 110 having a first side 111 attached to the first semiconductor component 101 and a second side 112 attached to the second semiconductor component 102.

The first and second semiconductor components 101, 102 can each include one or more parts or substrates of a semiconductor assembly, including, but not limited to, a redistribution structure, an interposer, a printed circuit board, a dielectric spacer, a semiconductor die (e.g., a logic die), or another suitable substrate known in the relevant art. The first and second semiconductor components 101, 102 can be formed from any one of a number of materials suitable for semiconductor processing methods, including silicon, glass, ceramic materials (e.g., aluminum oxide, aluminum nitride, or aluminum alloys), gallium arsenide, gallium nitride, organic laminates, and the like.

The bonding sheet 110 can include a bond material 115, thermal conductivity elements 120 (e.g., particle fillers) incorporated in the bond material 115, a plurality of openings 130a-d (referred to collectively as "openings 130") of different widths and extending at least partially through the bonding sheet 110, and etch resistant components 125 within one or more of the openings 130. In some embodiments, the bonding sheet 110 can further include adhesion promoters, and/or other elements to retard the polymerization or cross-linking within the bond material 115.

The bonding sheet 110 can be a self-supporting sheet that is non-compressible and configured to be patterned via die cutting, laser cutting, or other known plasma etching processes in the relevant art. As described in more detail below, the bonding sheet 110 can be manufactured to include specifications for overall flatness, thickness, thermal conductivity, elongation and/or other design factors. Each of these factors can vary according to the particular application the bonding sheet 110 is used for, and generally, the flatness, thickness, thermal conductivity and elongation can be any desirable value for these properties. In some embodiments, the sheet can include (a) a flatness specification across a surface width of the bonding sheet 110 of less than about 20 microns, (b) a thickness specification of about 200 microns or greater, about 120 microns, or less than about 100 microns, (c) a thermal conductivity specification of less than about 0.30 W/m·K, from about 0.3 W/m·K to about 0.5 W/m·K, or about 0.25 W/m·K to about 0.8 W/m·K, and (d) an elongation specification from about 5% to about 18%. The bonding sheet 110 can further include a thermal uniformity specification limiting the temperature differential across a surface of the bonding sheet 110 to about 2° C. or less.

The bond material 115 can comprise a polymer adhesive having an operating temperature ranging from about −60° C. to about 180° C. or greater. In some embodiments, the bond material 115 can include a silicon-based polymer, such as polydimethylsiloxane (PDMS), or fluoroelastomers (FKM), such as perfluoro-elastomers (FFKM). As described in more detail below, the bond material 115 is configured to be patterned and etched to create openings 130 adjacent to corresponding features (e.g., gas holes, fluid holes, power connections, etc.) on the first and/or second semiconductor components 101, 102.

As previously mentioned, the bond material 115 can include one or more thermal conductivity elements 120 incorporated within the bond material 115. The thermal conductivity elements 120 can include boron nitride (BN) particles (e.g., cubic-BN) or other materials, and/or organic fillers (e.g., silica particles) that are suspended in the bond material 115 and configured to decompose into the gas phase when exposed to plasma processes. As such, in some embodiments, the thermal conductivity elements 120 do not generate particles, or generate relatively few particles, when the bond material 115 is exposed to plasma and/or etching processes. In some embodiments, the particle size of the thermal conductivity elements 120 can include a matrix of different sized particles, and can have surface widths or diameters that vary in size from about one nanometer to about 10 microns. The amount of thermal conductivity elements 120 present in the bond material 115 can vary from about 5% to about 25% or greater, and be used to alter one or more of the specifications of the bonding sheet 110 previously discussed. For example, boron nitride particles have a higher thermal conductivity and a lower elasticity than PDMS. Accordingly, boron nitride particles within the bond material 115 will increase the thermal conductivity and decrease the elasticity of the bonding sheet 110 when the bonding sheet is made of PDMS. The boron nitride particles can also increase the mechanical strength of the bonding sheet 110. The organic fillers may include specifications similar to boron nitride, and the percentage of particles relative to the bond material 115 can be adjusted in a similar manner. The amount of thermal conductivity elements present in the bond material 115 may also be used to dilute the relative amount of bond material 115 used in the bonding sheet 110. Some bond materials 115, such as FFKM, for example, are a relatively expensive raw material, and thermal conductivity elements (e.g., Silica) can be used to decrease the amount of FFKM, and thus the overall cost of the bonding sheet 110.

The etch resistant components 125 placed within the openings 130 of the bonding sheet 110 can have a particular erosion resistance to plasma processes that is at least equal to the erosion resistance of the bond material 115. The etch resistant components 125 can include bulk ceramic materials and/or elements coated with one or more plasma resistant materials. In some embodiments, the etch resistant components 125 can include polyetheretherketone (PEEK), FFKM, and/or a PEEK disc coated with a plasma-resistant coating, such as yttrium oxide ($Y_2O_3$), yttrium fluoride ($YF_3$), yttrium oxyfluoride (YOF). The coated PEEK discs can be formed using a thin-film deposition process at relatively low temperatures (e.g., 25° C.). In some embodiments, such as when the bond material 115 includes FFKM, the etch resistant components 125 may be omitted because FFKM is sufficiently resistant to plasma processes and does not require an additional etch resistant component. In such an embodiment, a bonding sheet comprising FFKM and thermal conductivity particles embedded therein may be used on its own to bond semiconductor devices to one another.

As shown in the illustrated embodiment shown in FIG. 1B, the etch resistant components 125 can be configured to be positioned within the openings 130 of different widths, and/or the openings 130 can be sized in order to accommodate the etch resistant components 125. The illustrated embodiment shown in FIG. 1B is meant to illustrate just some of the different sizes, configurations, and spatial orientations of the openings 130 and etch resistant components 125 that can be included in a bonding sheet 110. In other embodiments, the openings 130 and etch resistant components 125 can include other sizes, configurations and spatial orientations. For example, in some embodiments, the openings 130 may all be generally of the same width.

One benefit of some embodiments of the present technology is the ability to form a bonding sheet that can be exposed to plasma processes without generating a significant amount of particles. For example, because the thermal conductivity elements can be configured to decompose into a gas when exposed to plasma processes and the etch resistant components are configured to be at least partially resistant to plasma processes, the exposure of the bonding sheet to plasma processes causes less particles to be generated relative to conventional bonding sheets. As such, by limiting the amount of particles generated during plasma processing, the strength of the bonding sheet is thereby maintained for longer periods and the likelihood of delamination of the attached first and/or second semiconductor devices is decreased.

Yet another benefit of some embodiments of the present technology is the ability to produce a bonding sheet that can withstand plasma and etch processes, while also being relatively inexpensive to produce. Forming bonding sheets with plasma resistant components can be impractical because the raw materials of such components are too expensive. With the present technology, however, the etch resistant components are incorporated into particular regions of an overall bonding material, and thus can be produced at a lower cost and be used for more semiconductor device processing applications.

Yet another benefit of some embodiments of the present technology is the ability to pattern the bonding sheets to very high tolerances. Unlike liquid components that are dispensed, flowable during the joining process, and can be generally difficult to pattern with high levels of precision, the sheet form can be precisely cut according to particular dimensions of the corresponding features on the adjacent semiconductor devices that are to be covered with the etch resistant components. This ability to more precisely cut the bonding sheet can thereby decrease the amount of exclusion area that is needed around the features, and ensure that only a minimum amount of bonding material is actually removed.

As a result, the additional bonding material that remains can provide a stronger bond with the adjacent semiconductor devices and more heat flow via conduction, thereby resulting in better thermal uniformity across a surface of the bonding material.

Figure 2A:
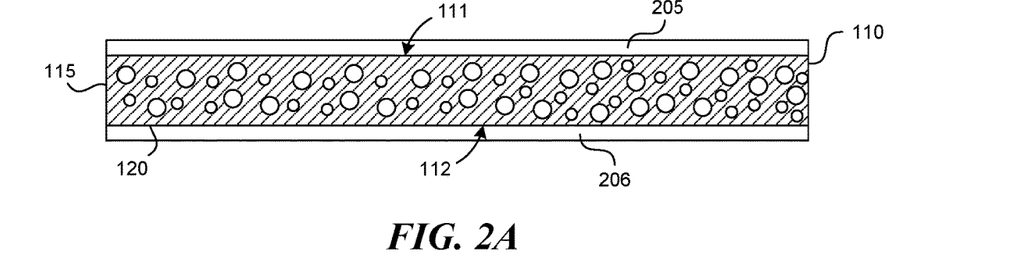
FIGS. 2A-2E are schematic cross-sectional views of a method of forming a semiconductor assembly in accordance with an embodiment of the present technology.

FIGS. 2A-2E are schematic cross-sectional views illustrating a method of forming a semiconductor assembly 200 ("assembly 200") (FIGS. 2B-2E). Referring first to FIG. 2A, the bonding sheet 110 includes the bond material 115 and the thermal conductivity elements 120 distributed and/or suspended within the bond material 115. The bonding sheet 110 can further include a first protective material 205 that substantially covers the first side 111 of the bonding sheet 110, and a second protective material 206 that substantially covers the second side 112 of the bonding sheet 110. The first and second protective materials 205, 206 can be, for example, adhesive films (e.g. die-attach films), epoxies, tapes, pastes, or other suitable materials. In some embodiments, the first and second protective materials 205, 206 are the same material and/or have substantially the same thickness.

Figure 2B:
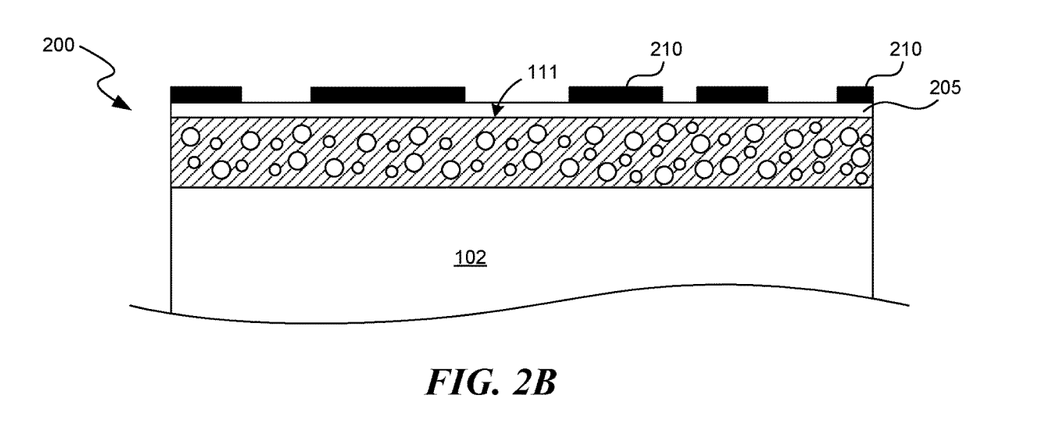

FIG. 2B shows the assembly 200 after the second protective material 206 is removed (e.g., peeled) from the bonding sheet 110, and the second side 112 of the bonding sheet 110 is brought in contact with the second semiconductor component 102. The first side 111 of the bonding sheet 110 can then be die-cut, laser-cut, and/or exposed to lithography techniques to form one or more openings (FIG. 2C) in the bonding sheet 110. As shown in the illustrated embodiment of FIG. 2B, a mask 210 (e.g., photoresist) can be disposed or formed over the first side 111 of the bonding sheet 110 to selectively pattern the bonding sheet 110 around corresponding features of the second semiconductor component 102, such as gas holes, fluid holes, power connections, or other distinct regions. As previously described, the bonding sheet 110 can be cut with an increased precision relative to conventional liquid bonding materials, and thus the clearances needed around the features of the second semiconductor device 102 can be minimized. In some embodiments, the bonding sheet 110 and/or adjacent semiconductor components being bonded to the bonding sheet 110 can include one or more alignment pins or marks to help ensure the mask 210 is accurately positioned around the corresponding features of the second semiconductor device 102.

Figure 2C:
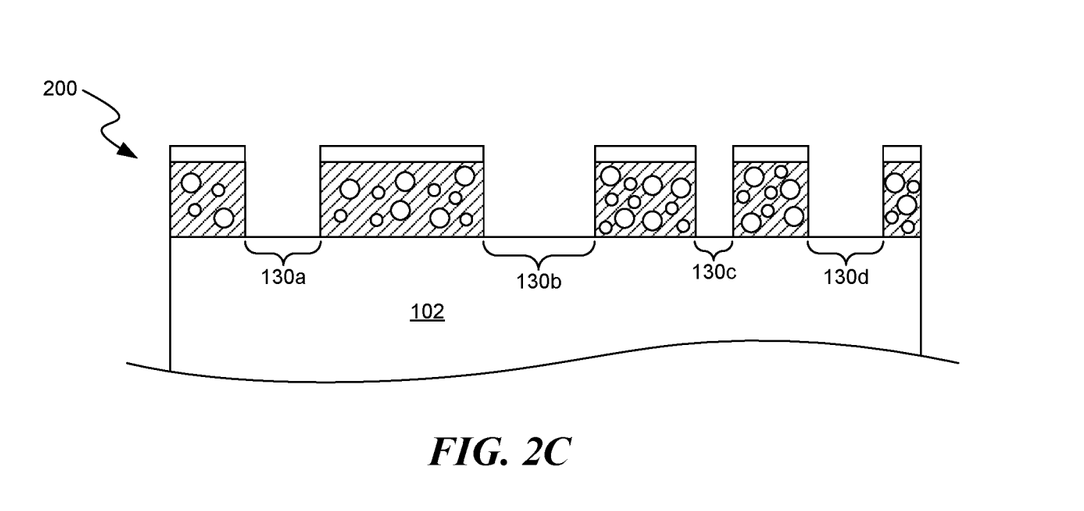
Figure 2D:
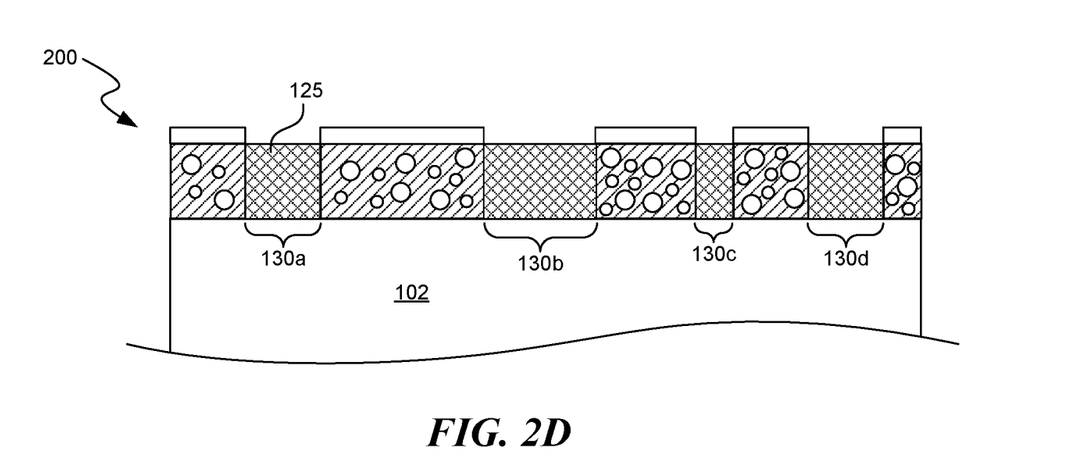
Figure 2E:
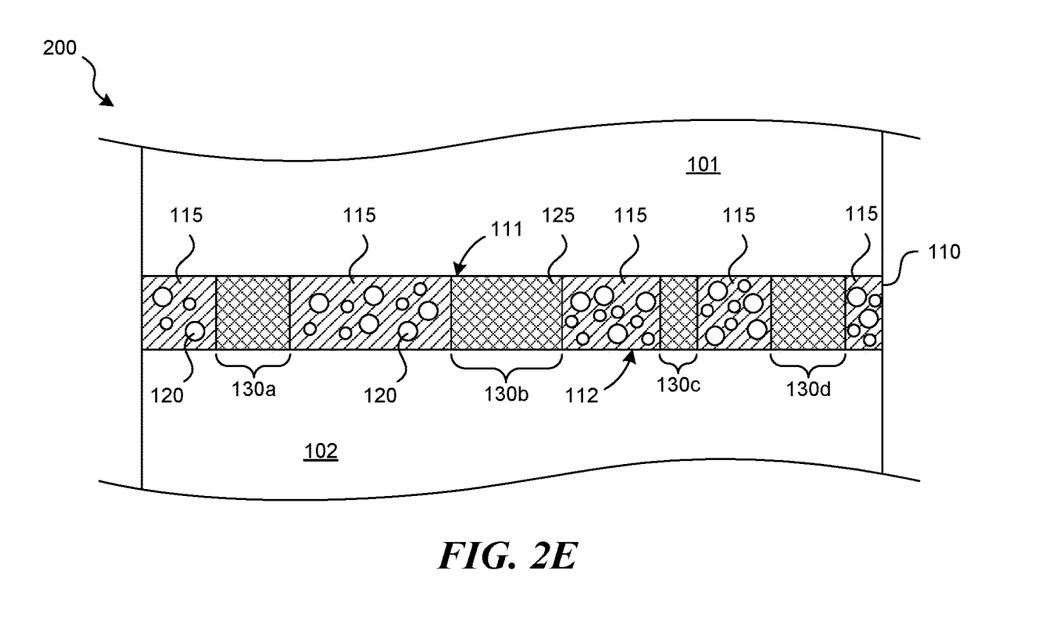

Referring next to FIGS. 2C and 2D, the openings 130 extending through the bonding sheet 110 are formed and subsequently filled with the etch resistant components 125. As previously described, the etch resistant components 125 can include solid PEEK discs (e.g., washers) configured to fit and be placed within specific openings 130 formed in the bonding sheet 110. In such an embodiment, the PEEK discs may have a thickness approximately equal to the thickness of the bonding sheet 110. In other embodiments, the etch resistant components 125 may be in a liquid form and be dispensed over the bonding sheet 110, thereby filling the openings 130. FIG. 2E shows the assembly 200 after the first protective material 205 is removed from the bonding sheet 110, and the first semiconductor component 101 is brought in contact with the first side 111 of the bonding sheet 110.

In other embodiments, the present technology can bond semiconductor components in different ways and/or in a different order than that previously disclosed. For example, in some embodiments, the bonding material and incorporated thermal conductivity elements incorporated therein may be present in a liquid form. In such an embodiment, the etch resistant components 125 may be positioned over particular regions of a first semiconductor component, and then the liquid bonding material and incorporated thermal conductivity elements may be dispensed over the etch resistant components 125. The liquid bonding material can be subsequently cured to form the bonding sheet.

This disclosure is not intended to be exhaustive or to limit the present technology to the precise forms disclosed herein. Although specific embodiments are disclosed herein for illustrative purposes, various equivalent modifications are possible without deviating from the present technology, as those of ordinary skill in the relevant art will recognize. In some cases, well-known structures and functions have not been shown or described in detail to avoid unnecessarily obscuring the description of the embodiments of the present technology. Although steps of methods may be presented herein in a particular order, alternative embodiments may perform the steps in a different order. Similarly, certain aspects of the present technology disclosed in the context of particular embodiments can be combined or eliminated in other embodiments. Furthermore, while advantages associated with certain embodiments of the present technology may have been disclosed in the context of those embodiments, other embodiments can also exhibit such advantages, and not all embodiments need necessarily exhibit such advantages or other advantages disclosed herein to fall within the scope of the technology. Accordingly, the disclosure and associated technology can encompass other embodiments not expressly shown or described herein, and the invention is not limited except as by the appended claims.

Throughout this disclosure, the singular terms "a," "an," and "the" include plural referents unless the context clearly indicates otherwise. Similarly, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising," "including," and "having" are used throughout to mean including at least the recited feature(s) such that any greater number of the same feature and/or additional types of other features are not precluded. Reference herein to "one embodiment," "an embodiment," or similar formulations means that a particular feature, structure, operation, or characteristic described in connection with the embodiment can be included in at least one embodiment of the present technology. Thus, the appearances of such phrases or formulations herein are not necessarily all referring to the same embodiment. Furthermore, various particular features, structures, operations, or characteristics may be combined in any suitable manner in one or more embodiments. As used herein, "about" or "approximately," when preceding a value, should be interpreted to mean plus or minus 10% of the value, unless otherwise indicated. For example, a thickness of about 200 microns should be interpreted to cover a thickness from 180 microns to 220 microns.

We claim:

1. A bonding sheet for use with semiconductor components, the bonding sheet comprising:
   a first side configured to be attached to a first semiconductor component;
   a second side configured to be attached to a second semiconductor component;
   an etch resistant material disposed in first regions of the bonding sheet;

a bond material disposed in second regions of the bonding sheet; and
a plurality of thermal conductive elements embedded within the bond material in the second regions,
wherein individual first regions are distinct from and positioned proximate to individual second regions; and
wherein the bonding sheet has:
a thickness less than about 200 microns,
a flatness across a length of the bonding sheet less than about 20 microns, and
an elongation specification less than about 20%.

2. The bonding sheet of claim 1 wherein the thermal conductivity elements are configured to decompose into a gas when exposed to plasma processes.

3. The bonding sheet of claim 1 wherein:
the bond material comprises at least one of polydimethylsiloxane (PDMS) and fluoroelastomers (FKM),
the etch resistant material comprises polyetheretherketone (PEEK), and
the thermal conductivity elements comprise organic fillers configured to decompose into a gas when exposed to plasma processes.

4. The bonding sheet of claim 1, further comprising:
a thermal conductivity less than about 0.3 W/m·K, and
a thermal uniformity such that a temperature differential across a surface of the bonding sheet is equal to or less than about 2° C. within a temperature range from about −60° C. to about 180° C.

5. The bonding sheet of claim 1 wherein the bond material comprises polydimethylsiloxane (PDMS).

6. The bonding sheet of claim 1 wherein the bond material comprises a fluoroelastomer (FKM).

7. The bonding sheet of claim 1 wherein the first regions correspond to openings in the bonding sheet filled with the etch resistant material, wherein diameters of at least a portion of the openings differ from one another, and wherein at least a portion of the openings are configured to be positioned to be aligned with a plurality of features on the first semiconductor components, the second semiconductor components, or both.

8. The bonding sheet of claim 1 wherein the thermal conductivity elements comprise particles suspended in the bond material, the particles comprising at least one of silica particles and boron nitride (BN).

9. The bonding sheet of claim 8 wherein the thermal conductivity elements comprise at least about 20% of the bond material of the bonding sheet.

10. The bonding sheet of claim 1 wherein the etch resistant material comprises polyetheretherketone (PEEK).

11. The bonding sheet of claim 10 wherein the etch resistant material comprises a plasma-resistant coating including at least one of yttrium oxide ($Y_2O_3$), yttrium fluoride ($YF_3$), and yttrium oxyfluoride (YOF).

12. The bonding sheet of claim 1 wherein each of the first and second regions extend through the entire bonding sheet from the first side to the second side, and wherein an outermost surface of the bonding sheet alternates between the etch resistant material and the bond material.

13. The bonding sheet of claim 1, further comprising one or more adhesion promoters in the bonding material configured to inhibit polymerization or cross-linking of the bond material.

14. A device for attaching one or more semiconductor components to one another, the device comprising:
a bonding sheet including—
a first side configured to be attached to a first semiconductor component,
a second side opposite the first side and configured to be attached to a second semiconductor component,
a bond material spanning substantially across a thickness of the bonding sheet, wherein the bond material comprises perfluoro-elastomers (FFKM);
an etch resistant material disposed in openings extending through the bonding sheet from the first side to the second side; and
a plurality of thermal conductivity elements embedded in the bond material, the thermal conductivity elements being configured to decompose into a gas when exposed to plasma processing.

15. The device of claim 14 wherein:
the etch resistant material is disposed in first regions of the bonding sheet, and
the bond material is disposed in second regions of the bonding sheet distinct from the first regions, the second regions comprising the openings.

16. The device of claim 14 wherein:
the bond material comprises at least one of polydimethylsiloxane (PDMS) and fluoroelastomers (FKM),
the etch resistant material comprises polyetheretherketone (PEEK), and
the thermal conductivity elements comprise organic fillers.

17. The device of claim 14 wherein the thickness is less than about 200 microns,
a conductivity less than about 0.3 W/m·K,
a flatness across a length of the bonding sheet less than about 20 microns, and
an elongation specification less than about 20%.

18. A bonding sheet for use with semiconductor components, the bonding sheet comprising:
a first side configured to be attached to a first semiconductor component;
a second side configured to be attached to a second semiconductor component;
an etch resistant material disposed in first regions of the bonding sheet;
a bond material disposed in second regions of the bonding sheet; and
a plurality of thermal conductive elements embedded within the bond material in the second regions,
a thermal conductivity less than about 0.3 W/m·K, and
a thermal uniformity such that a temperature differential across a surface of the bonding sheet is equal to or less than about 2° C. within a temperature range from about −60° C. to about 180° C.;
wherein individual first regions are distinct from and positioned proximate to individual second regions.

19. A bonding sheet for use with semiconductor components, the bonding sheet comprising:
a first side configured to be attached to a first semiconductor component;
a second side configured to be attached to a second semiconductor component;
an etch resistant material disposed in first regions of the bonding sheet, wherein the etch resistant material comprises polyetheretherketone (PEEK) and the etch resistant material comprises a plasma-resistant coating including at least one of yttrium oxide ($Y_2O_3$), yttrium fluoride ($YF_3$), and yttrium oxyfluoride (YOF);
a bond material disposed in second regions of the bonding sheet; and
a plurality of thermal conductive elements embedded within the bond material in the second regions, wherein individual first regions are distinct from and positioned proximate to individual second regions.

20. A device for attaching one or more semiconductor components to one another, the device comprising:
   a bonding sheet including—
      a first side configured to be attached to a first semiconductor component,
      a second side opposite the first side and configured to be attached to a second semiconductor component,
      a bond material spanning substantially across a thickness of the bonding sheet;
      an etch resistant material disposed in openings extending through the bonding sheet from the first side to the second side; and
   a plurality of thermal conductivity elements embedded in the bond material, the thermal conductivity elements being configured to decompose into a gas when exposed to plasma processing;
   wherein the thickness is less than about 200 microns,
   a thermal conductivity less than about 0.3 W/m·K,
   a flatness across a length of the bonding sheet is less than about 20 microns, and
   an elongation specification less than about 20%.

* * * * *